United States Patent [19]
Spak et al.

[11] Patent Number: 5,621,402
[45] Date of Patent: Apr. 15, 1997

[54] KEYPAD SCANNER

[75] Inventors: Michael E. Spak, Kyle; Dale E. Gulick, Austin, both of Tex.

[73] Assignee: Advanced Micro Devices, Inc., Sunnyvale, Calif.

[21] Appl. No.: 95,923

[22] Filed: Jul. 21, 1993

[51] Int. Cl.⁶ .................................................. H03K 17/94
[52] U.S. Cl. ............................................ 341/26; 379/368
[58] Field of Search ........................ 341/26; 200/5 A, 200/5 E; 379/368

[56] References Cited

U.S. PATENT DOCUMENTS

| | | | |
|---|---|---|---|
| 3,995,252 | 11/1976 | Ouellette | 341/26 X |
| 4,344,069 | 8/1982 | Prame | 341/26 |
| 4,381,502 | 4/1983 | Prame | 341/26 |
| 4,599,608 | 7/1986 | Matsuoka | 341/26 |
| 4,918,444 | 4/1990 | Matsubayashi | 341/26 X |
| 4,922,248 | 5/1990 | Shiga | 341/26 X |
| 5,117,455 | 5/1992 | Danish | 341/22 X |
| 5,264,845 | 11/1993 | Kwon et al. | 341/26 |
| 5,404,459 | 4/1995 | Gulick et al. | 395/275 |
| 5,408,639 | 4/1995 | Gulick et al. | 395/550 |
| 5,420,904 | 5/1995 | Gulick et al. | 377/107 |

*Primary Examiner*—Thomas Mullen
*Attorney, Agent, or Firm*—Jenkens & Gilchrist, P.C.

[57] ABSTRACT

A keypad scanner for a keypad having a plurality of keys which may be pressed into a down state includes circuitry for detecting when no or any key is pressed down and thereupon generating a no or any key down signal, circuitry for detecting when more than one key is pressed down and thereupon generating a multiple key down signal, and an interrupt generator coupled to the aforementioned circuitry. The interrupt generator itself includes circuitry for detecting a change in no or any key down signal level, circuitry for detecting a change in multiple key down signal level, and circuitry for generating an interrupt signal when either the circuitry for detecting a change in no or any key down signal level or the circuitry for detecting a change in multiple key down signal level detects a change.

17 Claims, 2 Drawing Sheets

KEYPAD SCANNER

CROSS-REFERENCE TO RELATED APPLICATIONS

This application is related to the following U.S. patent applications: U.S. Ser. No. 07/917,497, now U.S. Pat. No. 5,448,743; U.S. Ser. No. 07/917,489, now U.S. Pat. No. 5,408,639; U.S. Ser. No. 07/917,488, now abandoned; U.S. Ser. No. 07/917,503, now abandoned; U.S. Ser. No. 07/918, 627, now U.S. Pat. No. 5,555,287; U.S. Ser. No. 07/918,626, pending; U.S. Ser. No. 07/918,625, now abandoned; U.S. Ser. No. 07/918,524, now U.S. Pat. No. 5,404,459; U.S. Ser. No. 07/918,631, now abandoned; U.S. Ser. No. 07/918,632, now abandoned; U.S. Ser. No. 07/918,622, now abandoned; U.S. Ser. No. 07/918,621, now U.S. Pat. No. 5,420,904; and U.S. Ser. No. 08/088,007, now U.S. Pat. No. 5,515,050.

All of the related applications were filed on Jul. 21, 1992, except for the last listed, which was filed on Jul. 6, 1993; are assigned to the assignee of the present invention; and are hereby incorporated herein in their entirety by this reference thereto. The keypad scanner as defined in this invention can of course be used in a mobile phone as is evident from the incorporated Bowles et al. application (Ser. No. 07/917,489, now U.S. Pat. No. 5,408,639), the Gulick et al. application (Ser. No. 07/918,624, now U.S. Pat. No. 5,404,459), and the Gulick application (Ser. No. 07/918,521, now U.S. Pat. No. 5,420,904) listed above. An appendix is attached hereto of co-pending U.S. patent application Ser. No. 07/918,625 (as originally filed).

BACKGROUND OF THE INVENTION

1. Field of the Invention

The present invention generally relates to computer keypads. More particularly, the present invention relates to keypad scanners.

2. Description of the Related Art

A wide variety of devices may be used to interface with computer systems. One of the more popular of such devices is a keypad. Computer systems distinguish between keys on a keypad by assigning each key an individual value. These values are typically represented by a row signal and a column signal. When a key is pressed, the keypad presents the value of that key for input into the computer. In processing keypad input, computer systems typically first discern when a key has been pressed for input, and then they register the value of the key that has been pressed. Prior computer systems have used a keypad scanner to discern when a key has been pressed for input into the computer system. The keypad scanner periodically samples the key value presented by the keypad for input into the computer. A clock is used to determine the periodic rate at which the scanner samples the key values. After each sample, the scanner places the key value into a new value latch. The latched new value is then compared to an old value in a second latch. If there is a difference between the two latched values, then a status change signal is generated to indicate to the computer that a key has been pressed for input. Upon receiving a status change signal, the computer system registers the value of the key pressed and the scanner updates the old value latch with the value of the pressed key.

One disadvantage of prior art keypad scanners is the large amount of power required to operate them. Components of a keypad scanner include a clock and two latches, which require a constant supply of power. Also, power must be supplied to circuitry which compares the old latch value with the new latch value. The circuitry must be supplied with power for each cycle of the clock regardless of whether a change in keypad status has occurred. Effectively, therefore, the clock, two latches, and comparing circuitry of the keypad scanner consume power even during periods of inactivity of the keypad. Lacking keypad detectors that do not require power except when a change in keypad status occurs is a shortcoming and deficiency of the prior art.

Another disadvantage of prior art keypad scanners is their complexity. In order to operate, such keypad scanners must store an old key value into a first latch, read a new key value into a second latch, compare the new latched value with the old latched value, indicate to the computer if a difference exists between the two latched values, and then store in the first latch the new latched value if that value is different than the existing old latched value. This method of operation is highly complex and cannot be implemented inexpensively. Therefore, it would be advantageous to have a new, simpler, keypad scanner.

For the foregoing reasons, there is a need for a keypad scanner which requires less power in operation and which is less complex than prior art scanners.

SUMMARY OF THE INVENTION

To overcome the aforementioned shortcomings and deficiencies, the present invention provides an improved system for detecting changes in keypad status. One object of the present invention is to provide a system for detecting change in keypad state without requiring large power consumption as do prior art keypad scanners. Another object of the present invention is to provide a simple, inexpensive system for detecting keypad state change.

In one aspect of the present invention, row and column signals from the keypad are sent to a keypad state detector. Within the keypad state detector, the row and column signals are each sent to a no key detector and a multiple key detector. The no key detector senses from the row and column signals when no keys are currently being pressed on the keypad. When the no key detector senses that a key has been pressed, it generates a no key down signal. Likewise, when the multiple key detector senses that multiple keys have been pressed, it generates a multiple key down signal. The no key down signal and the multiple key down signal become the output from the keypad state detector.

An interrupt generator receives the no key down signal and the multiple key down signal. The no key down signal is received by a no key edge detector in the interrupt generator, which generates a no key edge signal when it senses a change in the no key down signal. Likewise the multiple key down signal is received by a multiple key edge detector in the interrupt generator, which generates a multiple key edge signal when the multiple key edge detector senses a change in the multiple key down signal. An or-gate inside the interrupt generator receives the no key edge signal and the multiple key edge signal. When either the no key edge signal or the multiple key edge signal are received by the or-gate, the or-gate generates an interrupt signal which is sent to the computer system. In this manner, an interrupt signal is sent to the computer whenever the keypad state progresses into or out of a single key down state.

In another aspect of the present invention, the row and column signals are each sent to an any key detector and a multiple key down detector in the keypad state detector. The any key detector senses from the row and column signals when no keys are currently being pressed on the keypad. When the any key detector senses that a key has been pressed, it gives an any key down signal. Likewise, when the multiple key detector senses that multiple keys have been pressed, it sends a multiple key down signal. The any key down signal and the multiple key down signal become the output from the keypad state detector. An interrupt generator receives the any key down signal add the multiple key down signal. The any key down signal is received by an any key edge detector in the interrupt generator, which generates an any key edge signal when it senses a change in the any key down signal. Likewise, the multiple key down signal is received by a multiple key edge detector in the interrupt generator, which generates a multiple key edge signal when the multiple key edge detector senses a change in the multiple key down signal. An or-gate inside the interrupt generator receives the any key edge signal and the multiple key edge signal. When either the any key edge signal or the multiple key edge signal are received by the or-gate, the or-gate generates an interrupt signal which is sent to the computer system. In this manner, an interrupt signal is sent to the computer whenever the keypad state progresses into or out of the single key down state.

In embodiments of the present invention, a keypad interrupt signal is sent to the computer without the use of clocks or latches, or without having to compare values when no activity occurs in the keypad. The result is a less complex system of generating a keypad interrupt signal which uses less power.

BRIEF DESCRIPTION OF THE DRAWINGS

For a more complete understanding of the present invention, and for further objects and advantages thereof, reference may now be made to the following detailed description taken in conjunction with the accompanying drawings herein.

DETAILED DESCRIPTION OF THE INVENTION

Figure 1:
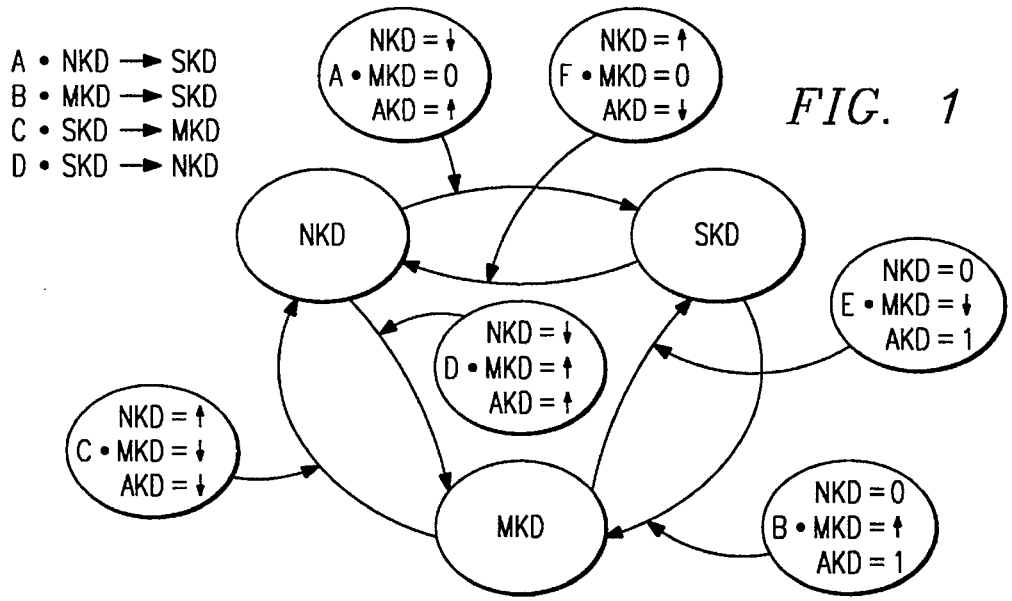
FIG. 1 is a state diagram showing the state of a keypad with respect to the state of the keys on the keypad.
Figure 2:
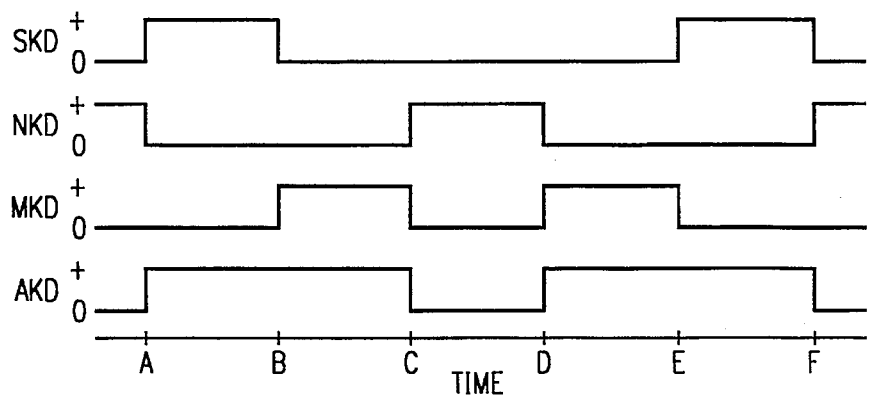
FIG. 2 is a time line showing keypad state over a period of time.
Figure 5:
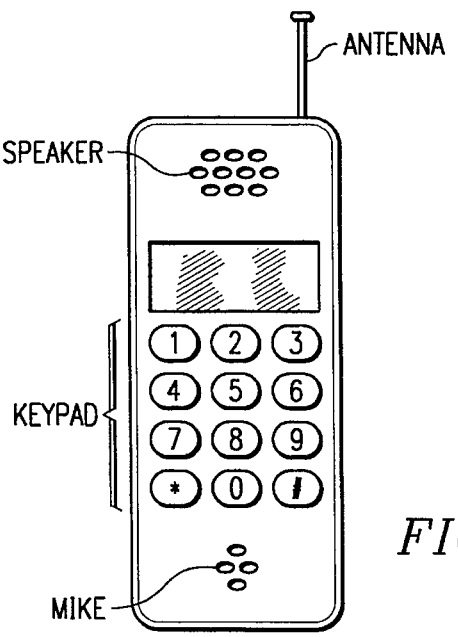
FIG. 5 is a block diagram of the keypad architecture of this invention being used in a mobile or cordless phone.

Referring now to the drawings, and more particularly to FIGS. 1 and 2, there is shown a state diagram for a keypad and a time line of the keypad state. The purpose of the discussion of FIGS. 1 and 2 is to describe generally the principles on which the present invention is based.

Referring now to FIG. 1, there is shown the state diagram for the keypad of a computer system. The state of the keypad is described by the three types of mutually exclusive conditions: no key down (NKD), single key down (SKD), and multiple key down (MKD). Data entry through the keypad is intended only when the keypad is in the single key down state. During the no key down state, the keypad has no value for input to the computer. Also, the multiple key down state is an error condition that can occur as a person's fingers strike two keys simultaneously while moving across the keypad. Therefore, the computer is only operationally and effectively concerned when the keypad progresses through the single key down state.

Referring still to FIG. 1, progression between the various states of a keypad are indicated by arrows A through F. An important part of the invention revolves around the fact that there is no transition indicated for progression from the state a single key being depressed to a different single key being depressed. This is because it is assumed to be a physical impossibility to go from one key to another key down without going through the no key down state or the multiple key down state.

Referring next to FIG. 2, there is shown a time line of the keypad state. The three keypad conditions (no key down, single key down, and multiple key down) from FIG. 1 are represented by signals over a period of time. Also, shown over the same period of time is a signal for a keypad state of any key down (AKD). Any key down is the logical inverse of no key down. When the keypad is in one of the four listed states, the signal for that state will have a positive signal. When the keypad is not in a particular state, the signal for that particular state will be zero.

Referring now to FIGS. 1 and 2 in combination, it can be seen that the time line in FIG. 2 starts with the keypad in the state condition of no key down. At time A, the keypad state progresses from the no key down condition to the single key down condition. During the progression at time A, the no key down signal experiences a decrease in level, the multiple key down signal experiences no change, and the any key down signal experiences an increase. At time B, the keypad state experiences a progression from the single key down condition to the multiple key down condition. During the progression at time B, the no key down signal experiences no change in level, the multiple key down signal experiences an increase, and the any key down signal experiences no change. At time C, the keypad state experiences a progression from the multiple key down condition to the no key down condition. During the progression at time C, the no key down signal experiences an increase in level, the multiple key down signal experiences a decrease, and the any key down signal experiences a decrease. At time D, the keypad state experiences a progression from the no key down condition to the multiple key down condition. During the progression at time D, the no key down signal experiences a decrease in level, the multiple key down signal experiences an increase, and the any key down signal experiences an increase. At time E, the keypad state experiences a progression from the multiple key down condition to the single key down condition. During the progression at time E, the no key down signal experiences no change in level, the multiple key down signal experiences a decrease, and the any key down signal experiences no change. And finally, at time F, the keypad state experiences a progression from the single key down condition back to the no key down condition. During the progression at time F, the no key down signal experiences an increase in level, the multiple key down signal experiences no change, and the any key down signal experiences a decrease.

It is the above principles on which the present invention is based. The present invention generates an interrupt signal whenever the keypad state progresses into, or out of, the single key down state, or whenever the keypad state progresses into, or out of, the multiple key down state. In this manner the computer will be alerted when a key has been pressed or released for entry of data and can read the value of that key. The keypad state progression into the single key down state is presented in FIG. 1 by the progression A (no key down to single key down) and E (multiple key down to single key down). The keypad state progression out of the single key down state is represented in FIG. 1 by the progression B (single key down to multiple key down) and F (single key down to no key down).

It can be seen in FIGS. 1 and 2 that changes into, or out of, the keypad state of single key down can be detected by monitoring the no key down signal or the any key down signal. The progression A occurs when only the no key down signal experiences a decrease in level (or trailing edge). The progression E occurs when only the multiple key down signal experiences a decrease in level (or trailing edge). The progression B occurs only when the multiple key down signal experiences an increase in level (or leading edge). The progression F occurs only when the no key down signal experiences an increase in level (or leading edge). Any other change in either the no key down signal or the multiple key down signal will only occur if there is a corresponding change in the other signal. However, these progressions (or transitions) can also be detected by embodiments of the present invention. For example, progressions C and D involve simultaneous edges for the no key down and multiple key down signals. Therefore, by monitoring the no key down signal and the multiple key down signal for a change in either signal, a progression into, or out of, the single key down state can be detected.

It can also be seen in FIGS. 1 and 2 that changes into, or out of, the keypad state of single key down can be detected by monitoring the any key down signal and the multiple key down signal. The progression A occurs when only the any key down signal experiences an increase in level (or leading edge). The progression E occurs when only the multiple key down signal experiences a decrease in level (or trailing edge). The progression B occurs when only the multiple key down signal experiences an increase in level (or leading edge). The progression F occurs only when the any key down signal experiences a decrease in level (or trailing edge). Any other change in either the any key down signal or the multiple key down signal will only occur if there is a corresponding change in the other signal. However, these progressions (or transitions) can also be detected by embodiments of the present invention. For example, progressions C and D involve simultaneous edges for the any key down and multiple key down signals. Therefore, by monitoring the any key down signal and the multiple key down signal for a change in either signal, a progression into, or out of, the single key down state can be detected.

Figure 3:
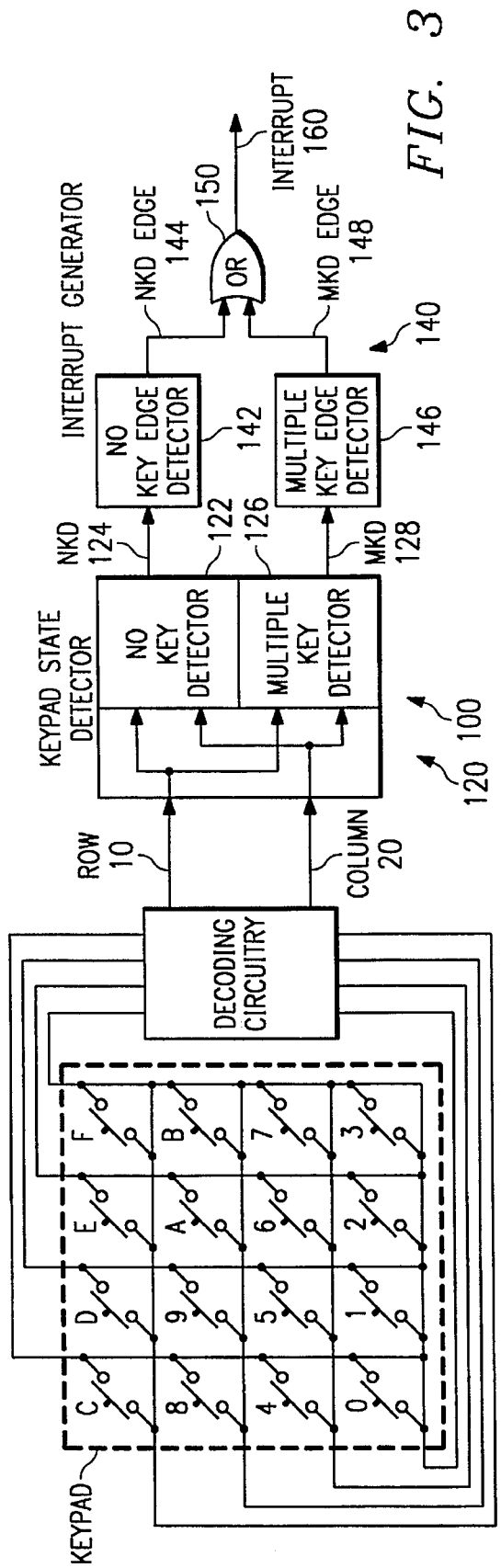
FIG. 3 is a block diagram of a general architectural structure of an embodiment of the present invention.

Referring now to FIG. 3, there is shown a keypad scanner 100 generally comprising a keypad state detector 120 and an interrupt generator 140. The purpose of the keypad state detector 120 is to sense the keypad state as shown in FIG. 1 from a keypad input of a row signal 10 and a column signal 20, and to generate the corresponding signals in FIG. 2. The purpose of the interrupt generator 140 is to detect certain changes in the signals generated by the keypad state detector 120 and to generate an interrupt signal 160 when those certain changes occur.

Referring still to FIG. 3, the keypad state detector 120 includes a no key detector 122, and a multiple key detector 126. The row signal 10 and the column signal 20 are fed into the no key detector 122 and the multiple key detector 126. The no key detector 122 then determines when the keypad is in the no key down state as reflected in FIG. 1. The no key detector 122 generates a no key down signal 124. When no key i s depress ed, the no key detector 122 generates a positive no key down signal 124. When a key is depressed, the no key down signal 124 from the no key detector 122 drops to a zero level. When the key depressed is released, the no key down signal 124 generated by the no key detector 122 once again increases to a positive level.

Likewise, the multiple key detector 126 senses when the keypad is in the multiple key down state as shown in FIG. 1, and generates a multiple key down signal 128. When less than two keys are depressed, the multiple key down signal 128 is at zero. When more than one key is depressed, the multiple key down signal 128 increases to a positive level. The multiple key down signal 128 maintains this positive level until the amount of keys depressed drops to one key or less. At that point, the multiple key down signal 128 drops from a positive level to a zero level. It is the no key down signal 124 generated by the no key down detector 122, and the multiple key down signal 128 generated by the multiple key detector 126, that become the output for the keypad state detector 120.

Still referring to FIG. 3, the interrupt generator 140 has a no key edge detector 142 which receives the no key down signal 124 from the keypad state detector 120, and a multiple key edge detector 146 which receives the multiple down signal 128 from the keypad state detector 120. When the no key down edge detector 142 senses an increase or decrease in the no key down signal 124, the no key edge detector 142 generates a no key edge signal 144. Likewise, when the multiple key edge detector 146 senses an increase or decrease in the multiple key down signal 128, the multiple key edge detector 146 generates a multiple key edge signal 148. The no key edge signal 144 and the multiple key edge signal 148 are fed into an or-gate 150 (OR). When the or-gate 150 senses either the no key edge signal 144 or the multiple key edge signal 148, it generates an interrupt signal 160. The interrupt signal 160 becomes the output for the interrupt generator 140. In this manner the keypad scanner 100 will generate an interrupt signal for changes in the keypad state into, or out of, the single key down condition or the multiple key down condition in FIG. 1 as represented by times A through F in FIG. 2.

Figure 4:
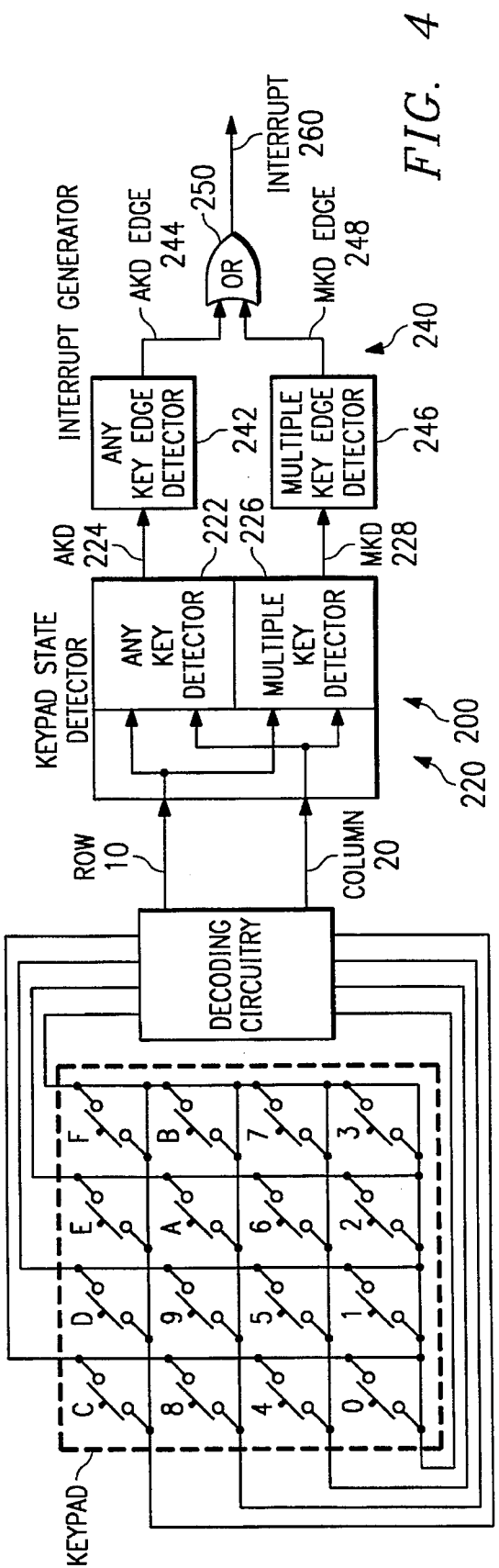
FIG. 4 is block diagram of a general architectural structure of an alternate embodiment of the present invention.

Referring now to FIG. 4, there is shown an alternate embodiment of the present invention. This alternate embodiment is a keypad scanner 200 generally comprising a keypad state detector 220 and an interrupt generator 240. The purpose of the keypad state detector 220 is to sense the keypad state as shown in FIG. 1 from an input of the row signal 10 and the column signal 20, and to generate the corresponding signals in FIG. 2. The purpose of the interrupt generator 240 is to detect certain changes in the signals generated by the keypad state detector 220 and to generate an interrupt signal 260 when the certain changes occur.

Referring still to FIG. 4, the keypad state detector 220 includes an any key detector 222, and a multiple key detector 226. The row signal 10 and the column signal 20 are fed into the any key detector 222 and the multiple key detector 226. The any key detector 222 then determines when the keypad is in the any key down state as reflected in FIG. 1. The any key detector 222 generates an any key down signal 224. When any key is depressed, the any key detector 222 generates a positive any key down signal 224. When no keys are depressed, the any key down signal 224 from the any key detector 222 drops to a zero level.

Likewise, the multiple key detector 226 senses when the keypad is in the multiple key down state as shown in FIG. 1, and generates a multiple key down signal 228. When less than two or more keys are depressed, the multiple key down signal 228 is at zero. When more than one key is depressed, the multiple key down signal 228 increases to a positive level. The multiple key down signal 228 maintains this positive level until the amount of keys depressed drops to one key or less. At that point, the multiple key down signal 228 drops from a positive level to a zero level. It is the any key down signal 224 generated by the any key detector 222, and the multiple key down signal 228 generated by the multiple key detector 226, that become the output for the keypad state detector 220.

Still referring to FIG. 4, the interrupt generator 240 has an any key edge detector 242 which receives the any key down signal 224 from the keypad state detector 220, and a multiple key edge detector 246 which receives the multiple down signal 228 from the keypad state detector 220. When the any key edge detector 242 senses an increase or decrease in the any key down signal 224 the any key edge detector 242 generates an any key edge signal 244. Likewise, when the multiple key edge detector 246 senses an increase or decrease in the multiple key down signal 228, the multiple key edge detector 246 generates a multiple key edge signal 248. The any key edge signal 244 and the multiple key edge signal 248 are fed into an or-gate 250 (OR). When the or-gate 250 senses either the any key edge signal 244 or the multiple key edge signal 248, it generates an interrupt signal 260. The interrupt signal 260 becomes the output for the interrupt generator 240. In this manner the keypad scanner 200 will generate an interrupt signal for changes in the keypad state into, or out of, the single key down condition or the multiple key down condition in FIG. 1 as represented by times A through F in FIG. 2.

The present invention therefore provides a new and improved method of detecting keypad activity for computer input which not only reduces the power consumption in determining keypad input, but which also provides a less complex system of determining keypad activity for input. Obviously, numerous modifications and variations are possible in view of the above teachings. For example, the no key down, multiple key down, and any key down states are not required to be represented by positive signals; what is important is that the signals experience an increase or decrease in value when the keypad changes to, or from, those states. Likewise, the no key down signal 124, the multiple key down signal 128, the any key down signal 224, and the multiple key down signal 228 are not required to represent the corresponding states with positive values; what is important is that these signals experience an increase or decrease in value when the keypad changes to, or from, those states. As a further example of modifications and variations, the key value of the keypad can be represented by more than one row or column signal. Accordingly, within the scope of the appended claims, the present invention may be practiced otherwise than as specifically described herein.

What is claimed is:

1. A keypad scanner for a keypad having a plurality of keys for providing user input to a user input receivable device, each one of said plurality of keys having a pressed and unpressed position, said keypad scanner comprising:

a no key down signal generating means for detecting when none of said plurality of keys are in a pressed down position, and for generating a no key down signal in response thereto;

a multiple key down signal generating means for detecting when more than one of said plurality of keys are in a pressed down position, and for generating a multiple key down signal in response thereto;

an interrupt signal generator means, coupled to said no key down signal generating means, said multiple key down signal generating means, and said user input receivable device, for detecting said no key down signal and said multiple key down signal, and for generating an interrupt signal responsive to either said no key down signal or Said multiple key down signal to said user input receivable device; and wherein said interrupt signal generator means comprises means for detecting an edge of said no key down signal.

2. The keypad scanner as recited in claim 1 wherein said user input receivable device is a mobile phone.

3. The keypad scanner as recited in claim 1 wherein said user input receivable device is a cordless phone.

4. A keypad scanner for a keypad having a plurality of keys for providing user input to a user input receivable device, each one of said plurality of keys having a pressed and unpressed position, said keypad scanner comprising:

an any key down signal generating means for detecting when any one of said plurality of keys is in a pressed down position, and for generating an any key down signal in response thereto;

a multiple key down signal generating means for detecting when more than one of said plurality of keys are in a pressed down position, and for generating a multiple key down signal in response thereto; and an interrupt signal generator means, coupled to said any key down signal generating means, said multiple key down signal generating means, and said user input receivable device, for detecting said any key down signal and said multiple key down signal, and for generating an interrupt signal responsive to either said a key down signal or said multiple key down signal to said user input receivable device.

5. The keypad scanner as recited in claim 4, wherein said interrupt signal generator means comprises means for detecting an edge of said a key down signal.

6. The keypad scanner as recited in claim 5, wherein said interrupt signal generator means comprises means for detecting an edge of said multiple key down signal.

7. The keypad scanner as recited in claim 6, wherein said interrupt generator means comprises an or-gate.

8. The keypad scanner as recited in claim 7 wherein said user input receivable device is a mobile phone.

9. The keypad scanner as recited in claim 7 wherein said user input receivable device is a cordless phone.

10. A keypad scanner for a keypad having a plurality of keys for providing user input to a user input receivable device, each one of said plurality of keys having a pressed and unpressed position, said keypad scanner comprising:

an any key down signal generating means for detecting when any one of said plurality of keys is in a pressed down position, and for generating an any key down signal in response thereto;

a multiple key down signal generating means for detecting when more than one of said plurality of keys are in a pressed down position, and for generating a multiple key down signal in response thereto;

an interrupt signal generator means, coupled to said any key down signal generating means, said multiple key down signal generating means, and said user input receivable device, for detecting said any key down signal and said multiple key down signal, and for generating an interrupt signal responsive to either said any key down signal or said multiple key down signal to said user input receivable device; and means to switch a state machine from at least a first state indicative of no key down on said keypad to a second state indicative of any key down.

11. The keypad scanner as recited in claim 10, wherein said interrupt signal generator means comprises means for detecting an edge of said any key down signal.

12. The keypad scanner as recited in claim 11, wherein said interrupt signal generator means comprises means for detecting an edge of said multiple key down signal.

13. The keypad scanner as recited in claim 12, wherein said interrupt signal generator means comprises an or-gate.

14. A keypad scanner for a keypad having a plurality of keys, each one of the plurality of keys having a pressed and unpressed position, said keypad scanner comprising:

- a no key down detector having a no key detector output, said no key down detector for detecting when none of the plurality of keys are in the pressed position and when at least one of the plurality of keys are in the pressed position, and for changing the no key detector output between a no key down signal when said no key down detector detects that none of the plurality of keys are in the pressed position and a key down signal when said no key down detector detects that at least one of the plurality of keys are in the pressed position;

- a multiple key down detector having a multiple key detector output, said multiple key down detector for detecting when more than one of the plurality of keys are in the pressed position and when less than two of the plurality of keys are in the pressed position, and for changing the multiple key detector output between a multiple key down signal when said multiple key down detector detects that more than one of the plurality of keys are in the pressed position and a less than two keys down signal when said multiple key down detector detects that less than two of the plurality of keys are in the pressed position;

- a no key edge detector receiving the no key detector output and having a no key edge detector output, said no key edge detector for generating a no key edge signal on the no key edge detector output upon detecting a change in the no key detector output between the no key down signal and the key down signal;

- a multiple key edge detector receiving the multiple key detector output and having a multiple key edge detector output, said multiple key edge detector for generating a multiple key edge signal on the multiple key edge detector output upon detecting a change in the multiple key detector output between the multiple key down signal and the less than two keys down signal; and

- an interrupt signal generator having an interrupt signal generator output and receiving the no key edge detector output and the multiple key edge detector output, said interrupt signal generator for generating an interrupt signal on said interrupt signal generator output when either said no key edge detector generates the no key edge signal on the no key edge detector output or said multiple key edge detector generates the multiple key edge signal on the multiple key edge detector output.

15. The keypad scanner as recited in claim 14, wherein said interrupt signal generator comprises an or-gate.

16. A keypad scanner for a keypad having a plurality of keys, each one of the plurality of keys having a pressed and unpressed position, said keypad scanner comprising:

- an any key down detector having an any key detector output, said any key down detector for detecting when at least one of the plurality of keys are in the pressed position and when none of the plurality of keys are in the pressed position, and for changing the any key detector output between an any key down signal when said any key down detector detects that at least one of the plurality of keys are in the pressed position and a no key down signal when said any key down detector detects that none of the plurality of keys are in the pressed position;

- a multiple key down detector having a multiple key detector output, said multiple key don detector for detecting when more than one of the plurality of keys are in the pressed position and when less than two of the plurality of keys are in the pressed position, and for changing the multiple key detector output between a multiple key down signal when said multiple key down detector detects that more than one of the plurality of keys are in the pressed position and a less than two keys down signal when said multiple key down detector detects that less than two of the plurality of keys are in the pressed position;

- an any key edge detector receiving the any key detector output and having an any key edge detector output, said any key edge detector for generating an any key edge signal on the any key edge detector output upon detecting a change in the any key detector output between the any key down signal and the no key down signal;

- a multiple key edge detector receiving the multiple key detector output and having a multiple key edge detector output, said multiple key edge detector for generating a multiple key edge signal on the multiple key edge detector output upon detecting a change in the multiple key detector output between the multiple key down signal and the less than two keys down signal; and

- an interrupt signal generator having an interrupt signal generator output and receiving the any key edge detector output and the multiple key edge detector output, said interrupt signal generator for generating an interrupt signal on the interrupt signal generator output when either said any key edge detector generates the any key edge signal on the any key edge detector output or said multiple key edge detector generates the multiple key edge signal on the multiple key edge detector output.

17. The keypad scanner as recited in claim 16, wherein said interrupt signal generator comprises:

an or-gate.

* * * * *

UNITED STATES PATENT AND TRADEMARK OFFICE
CERTIFICATE OF CORRECTION

PATENT NO. : 5,621,402
DATED : Apr. 15, 1997
INVENTOR(S) : Spak et al.

It is certified that error appears in the above-identified patent and that said Letters Patent is hereby corrected as shown below:

| | |
|---|---|
| Column 1, line 13 | Replace "07/918,524" With --07/918,624-- |
| Column 1, line 27 | Replace "07/918,521" With --07/918,621-- |
| Column 3, line 8 | Replace "add" With --and-- |
| Column 5, line 66 | Replace "i s depress ed," With --is depressed,-- |
| Column 8, line 5 | Replace "Said" With --said-- |
| Column 8, line 30 | Replace "a" With --any-- |
| Column 8, line 34 | Replace "a" With --any-- |
| Column 8, line 40 | Replace "7" With --4-- |

UNITED STATES PATENT AND TRADEMARK OFFICE
CERTIFICATE OF CORRECTION

PATENT NO. : 5,621,402
DATED : Apr. 15, 1997
INVENTOR(S) : Spak et al.

It is certified that error appears in the above-identified patent and that said Letters Patent is hereby corrected as shown below:

Column 8, line 42    Replace "7" With --4--

Column 10, line 17    Replace "don" With --down--

Signed and Sealed this

Thirtieth Day of June, 1998

Attest:

BRUCE LEHMAN

*Attesting Officer*    *Commissioner of Patents and Trademarks*